(12) United States Patent
Junghähnel et al.

(10) Patent No.: US 9,909,208 B2
(45) Date of Patent: Mar. 6, 2018

(54) METHOD FOR DEVELOPING A COATING HAVING A HIGH LIGHT TRANSMISSION AND/OR A LOW LIGHT REFLECTION

(71) Applicant: Fraunhofer-Gesellschaft zur Förderung der angewandten Forschung e.V., Munich (DE)

(72) Inventors: Manuela Junghähnel, Dresden (DE); Thomas Preußner, Goppeln (DE); Ullrich Hartung, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 15/233,542

(22) Filed: Aug. 10, 2016

(65) Prior Publication Data

US 2017/0051397 A1    Feb. 23, 2017

(30) Foreign Application Priority Data

Aug. 17, 2015 (DE) .......................... 10 2015 113 542

(51) Int. Cl.
*H01L 21/31* (2006.01)
*C23C 14/35* (2006.01)
(Continued)

(52) U.S. Cl.
CPC .......... *C23C 14/35* (2013.01); *B81C 1/00476* (2013.01); *C03C 3/061* (2013.01); *C03C 15/00* (2013.01); *C03C 17/006* (2013.01); *C03C 17/245* (2013.01); *C23C 14/081* (2013.01); *C23C 14/086* (2013.01); *C23C 14/10* (2013.01);
(Continued)

(58) Field of Classification Search
CPC ............ C03C 2201/32; C03C 2201/40; C03C 2217/425; C03C 2217/732; C03C 2217/91; C03C 15/00; C03C 17/006; C03C 17/245; B81C 1/00476
USPC ............... 438/720, 722, 723, 725, 758, 763; 216/83
See application file for complete search history.

(56) References Cited

U.S. PATENT DOCUMENTS 9,039,906 B2    5/2015  Schulz et al.
9,607,733 B2*   3/2017  Takada .................. H01B 5/002
(Continued)

FOREIGN PATENT DOCUMENTS

CN    103203912 A    7/2013
CN    103451609 A    12/2013
(Continued)

*Primary Examiner* — Lan Vinh
(74) *Attorney, Agent, or Firm* — Brinks Gilson & Lione

(57) ABSTRACT

A method for developing a coating having a high light transmission and/or a low light reflection is provided. The method relates to a process for developing a coating with a high light transmission and/or a low light reflection, where the coating is deposited on a substrate. The coating is deposited as a mixed coating comprising a material A and a material B, where the coating is developed to have a coating thickness profile in which the lowest proportion of the material B is on the substrate surface and the highest proportion of coating material is on the coating surface. The material B is at least partially removed from the coating after deposition of the coating on the substrate.

16 Claims, 1 Drawing Sheet

(51) Int. Cl.

| | | |
|---|---|---|
| *B81C 1/00* | (2006.01) | |
| *C03C 17/245* | (2006.01) | |
| *C23C 14/08* | (2006.01) | |
| *C23C 14/10* | (2006.01) | |
| *C23C 14/58* | (2006.01) | |
| *C03C 17/00* | (2006.01) | |
| *C03C 3/06* | (2006.01) | |
| *C03C 15/00* | (2006.01) | |
| *C23C 14/24* | (2006.01) | |
| *C23C 16/44* | (2006.01) | |
| *G02B 1/115* | (2015.01) | |

(52) U.S. Cl.
CPC ............ *C23C 14/24* (2013.01); *C23C 14/352* (2013.01); *C23C 14/5826* (2013.01); *C23C 14/5873* (2013.01); *C23C 16/44* (2013.01); *G02B 1/115* (2013.01); *C03C 2201/32* (2013.01); *C03C 2201/40* (2013.01); *C03C 2217/425* (2013.01); *C03C 2217/732* (2013.01); *C03C 2217/91* (2013.01); *C03C 2218/33* (2013.01)

(56) References Cited

U.S. PATENT DOCUMENTS

| | | |
|---|---|---|
| 2005/0224779 A1* | 10/2005 | Wang ..................... B82Y 10/00 257/9 |
| 2005/0233083 A1 | 10/2005 | Schulz et al. |
| 2007/0158716 A1* | 7/2007 | Rinerson ............. G11C 11/5685 257/295 |
| 2012/0107558 A1* | 5/2012 | Koval .................. C03C 17/3429 428/142 |
| 2014/0272127 A1 | 9/2014 | Kalyankar |
| 2015/0075610 A1* | 3/2015 | Chen ................... H01L 31/0352 136/256 |
| 2015/0171261 A1 | 6/2015 | Domine |

FOREIGN PATENT DOCUMENTS

| | | |
|---|---|---|
| DE | 102 41 708 A1 | 3/2004 |
| DE | 10 2004 014 323 A1 | 10/2005 |
| DE | 10 2005 015 631 A1 | 10/2006 |
| DE | 10 2005 020 168 A1 | 11/2006 |
| DE | 10 2005 053 262 A1 | 5/2007 |
| DE | 10 2007 012 103 A1 | 11/2007 |
| DE | 10 2013 106 392 A1 | 12/2014 |
| DE | 10 2014 100 769 A1 | 7/2015 |

* cited by examiner

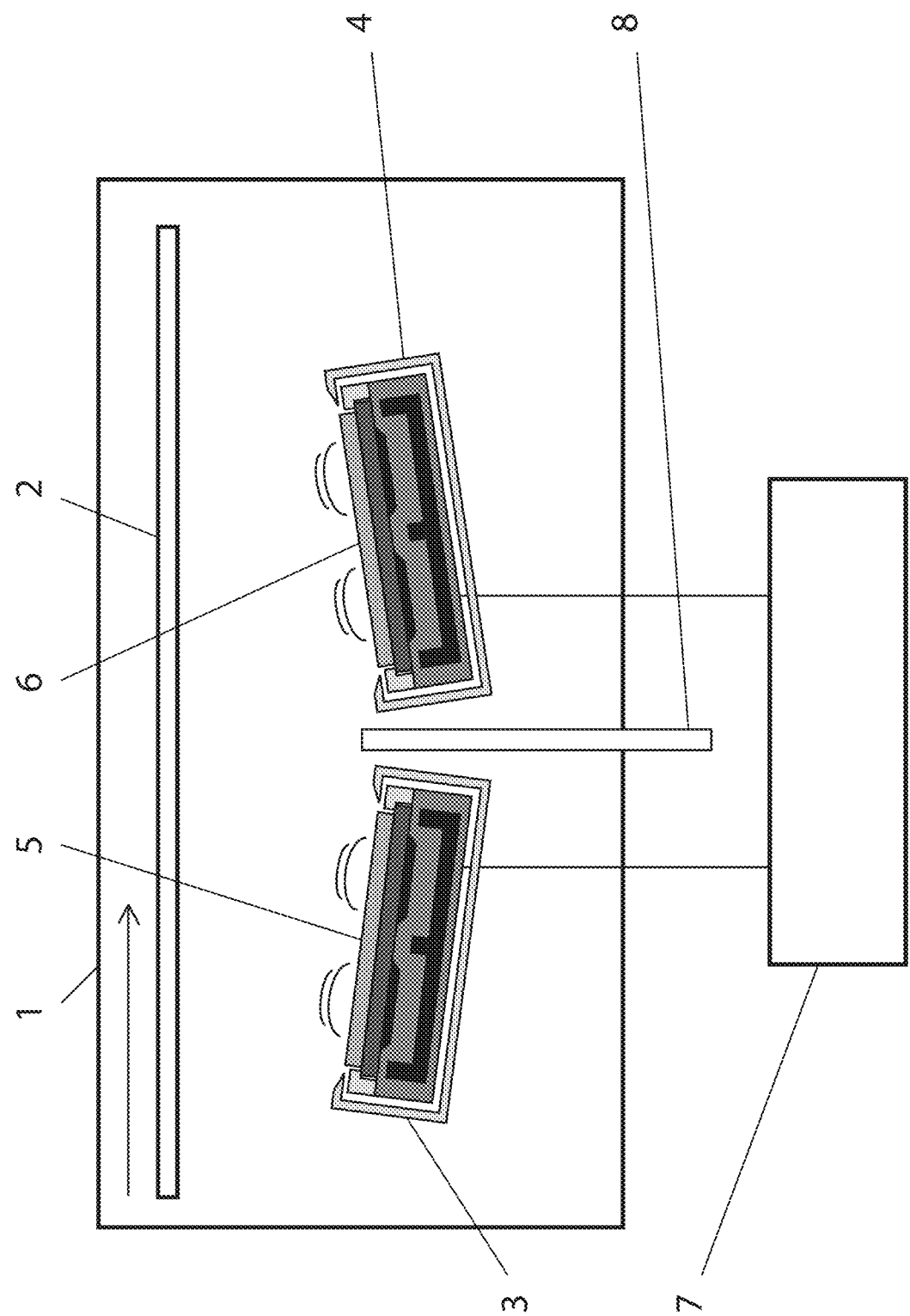

METHOD FOR DEVELOPING A COATING HAVING A HIGH LIGHT TRANSMISSION AND/OR A LOW LIGHT REFLECTION

CROSS-REFERENCE TO RELATED APPLICATIONS

This application claims priority under 35 USC § 119 to Germany Patent Application No. 10 2015 113 542.6, filed Aug. 17, 2015, and entitled "Verfahren zum Ausbilden einer Schicht mit hoher Lichttransmission und/oder niedriger Lichtreflexion," the entire contents of which are hereby incorporated herein by reference.

TECHNICAL FIELD

The invention relates to a method for developing a coating on a substrate, which coating causes an increase in the light transmission and/or a reduction in the light reflection.

BACKGROUND

In many optical applications, it is required to provide a substrate with an anti-reflective coating. An anti-reflective coating is often realized by depositing a number of partial coatings one-atop-the-other, wherein partial coatings with a low refractive index alternate with partial coatings with a high refractive index (DE 10 2005 015 631 A1). The depositing of a plurality of partial coatings, however, requires either a relatively large amount of time if a substrate is repeatedly passed through two coating stations for the depositing of two different types of partial coatings, or highly complex equipment if the substrate is passed through a number of coating stations corresponding to a number of partial coatings in one pass.

From DE 10 2005 020 168 A1 a method for depositing an anti-reflective coating is known wherein a porous coating comprising a metal or a mixed metal oxide is deposited using a sol-gel method. The pores inside the coating cause the radiation hitting the coating at the pore borders to reflect at different angles, which results in anti-reflection. At the same time, however, the pores inside the coating also cause a reduction in the transmission which restricts the range of applications of this method.

Another alternative for reducing the interface reflection of plastic substrates has been described in DE 102 41 708 A1. With this method, a refractive index gradient coating is formed on a substrate surface by bombarding a polymer substrate with ions. Such methods, however, can frequently not be applied to extensive substrates, like, for example, plastic foils.

BRIEF DESCRIPTION OF THE DRAWINGS

FIG. 1 shows a schematic diagram of a device with which a gradient coating can be deposited.

DETAILED DESCRIPTION

The underlying technical problem of the invention is to provide a method for the development of a coating with a high light transmission and/or a reduced light reflection of a high bandwidth, the use of which can overcome the prior art disadvantages. In particular, it can also be possible with the method of the present invention to allow the coating to be formed on extensive substrates.

With the method according to the present invention, a coating having a high light transmission and/or a low light reflection is formed on a substrate by first depositing the coating as a mixed coating of a material A and a material B. By doing so, the coating is formed having a thickness profile with a gradient such that the lowest proportion of the material B is on the substrate surface, and the highest proportion of the coating material is on the coating surface. After the depositing of the coating, the material B is at least partially removed from the coating. While removing the material B from the coating, care should be taken, as far as possible, not to damage the structure of the material A formed inside the gradient coating. By at least partially removing the material B from the gradient coating, a jagged structure develops which has the most coating material directly on the substrate surface, and increasingly less coating material towards the coating surface in terms of area density. Such a jagged structure causes a reduced light reflection and at the same time can increase the light transmission with a translucent substrate.

Different processes can be applied to deposit the gradient coating. Wet chemical deposition processes can be realized for this purpose as well as vacuum coating processes, of which, for example, chemical vapor deposition (or in short CVD), or physical vapor deposition (or in short PVD) can be applied. Of the PVD processes, co-sputtering, or also co-vaporization, is especially suited because a continuous coating gradient with a dynamic coating of the substrate can be very accurately adjusted with these deposition processes. Alternatively, with the method according to the present invention, the coating gradient can, however, also be adjusted in a staggered manner over the coating thickness profile. This can, for example, be realized by depositing different partial coatings at different mixing proportions of the materials A and B one-atop-the-other on a substrate.

Different processes can also be applied when at least partially removing the material B from the gradient coating. Depending on the applied materials A and B, chemical etching can be suitable for this purpose, as well as reactive-ion etching, or the use of a solvent.

The present invention will be explained hereinafter in more detail using an exemplary embodiment. FIG. 1 shows a schematic diagram of a device with which a gradient coating can be deposited according to the present invention. The device comprises a vacuum chamber 1, through which a translucent substrate 2 made of glass is moved in the direction of the arrow. When it is passed through the vacuum chamber 1, the vacuum chamber 2 is first moved over a magnetron 3 and subsequently over a magnetron 4. After the inventive treatment of the substrate 2 it should have a reduced light reflection and an increased light transmission. It is advantageous if a material is selected as material A whose refractive index is as close to the refractive index of the substrate as possible. At the same time, as regards the material A, there is always the demand that the material A must withstand the process of removing the material B after the coating deposition process. As the substrate 2 consists of glass in the exemplary embodiment, doped conductive silicon oxide, which has a refractive index that is similar to the glass substrate 2, was selected as material A. Alternatively, silicon oxide-containing compounds are also suitable for this purpose. AZO (aluminum zinc oxide) was selected as material B. But other zinc oxide-containing compounds or zinc oxide can also be used as material B.

In the exemplary embodiment, the magnetron is provided with a target 5 comprising silicon oxide and the magnetron 4 with a target 6 comprising AZO. The magnetron 3 and the magnetron 4 are electrically connected to a bipolar pulsating power supply 7 and are thus alternately and counter-directionally switched as a cathode or an anode of a magnetron discharge. In order to operate the magnetrons 3 and 4, the process gas argon is introduced through an inlet 8 into the vacuum chamber 1. In this case, the magnetrons 3 and 4 are oriented with respect to one another such that the clouds of particles atomized by the targets 5 and 6 are, in part, superposed before the particles are deposited on the substrate 2. This co-sputtering of the targets 5 and 6 with the partially superposed particle clouds leads to the depositing of a gradient coating on the moved substrate 2, such that silicon oxide is exclusively deposited on the surface of the substrate 2. With a growing coating thickness, the coating then also has a proportion of AZO which continually increases with an increasing coating thickness and finally amounts to 100% on the coating surface. In the exemplary embodiment, the gradient coating is deposited with a thickness of 1 µm.

For the inventive removal of the AZO from the deposited gradient coating, chemical etching by means of a 0.5% hydrochloric acid solution was selected. After a few minutes in such a hydrochloric acid solution, the AZO is to a large part removed from the gradient coating, while the structure of the silicon oxide formed in the gradient coating is almost completely preserved. The residual coating with a 0.6 µm thickness and a jagged coating structure generated in this manner results in a compound comprising the substrate 2 and a coating deposited thereon having a higher light transmission and a lower light reflection compared to the uncoated substrate 2.

It should explicitly be mentioned that the coating materials silicon oxide and AZO mentioned in the exemplary embodiment merely are of an exemplary nature and do not restrict the range of materials for the material A and material B. For the material B, there is only a limitation in that it must be at least partially removable with known process steps from a gradient coating deposited according to the present invention without substantially destroying the coating structure of the material A configured in the gradient coating. The material A is limited in that it must withstand the process step of removing the material B from the gradient coating. It is advantageous if the material A additionally also has a refractive index that comes as close as possible to the refractive index of the substrate.

To clarify the use of and to hereby provide notice to the public, the phrases "at least one of <A>, <B>, . . . and <N>" or "at least one of <A>, <B>, <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

The invention claimed is:

1. A method for developing a coating, the method comprising:
   depositing the coating on a substrate, wherein the coating is deposited as a mixed coating comprising a material A and a material B, wherein the coating is deposited with a gradient over the coating thickness profile such that the lowest proportion of the material B is on the substrate surface and the highest proportion is on the coating surface; and
   at least partially removing the material B from the coating after the coating is deposited on the substrate, preserving at least a portion of the material A in an area of the coating from which the material B is removed.

2. The method according to claim 1, wherein a wet chemical deposition process is used for depositing the coating.

3. The method according to claim 1, wherein a vacuum deposition process is used for depositing the coating.

4. The method according to claim 3, wherein a PVD or a CVD process is used for depositing the coating.

5. The method according to claim 4, wherein the material A and the material B are deposited by co-sputtering on the substrate, wherein the substrate moves relative to a sputtering device.

6. The method according to claim 1, wherein chemical etching is used to remove the material B from the coating.

7. The method according to claim 6, wherein a hydrochloric acid solution is used for chemical etching.

8. The method according to claim 1, wherein reactive-ion etching is used to remove the material B from the coating.

9. The method according to claim 1, wherein a solvent is used to remove the material B from the coating.

10. The method according to claim 1, wherein silicon oxide or a silicon oxide-containing compound is used as material A.

11. The method according to claim 1, wherein zinc oxide or a zinc oxide-containing compound is used as material B.

12. The method according to claim 1, wherein the gradient over the coating thickness profile includes a continuous gradient over the coating thickness profile.

13. The method according to claim 1, wherein a mixture of the material A and material B deposited in the coating comprises increasingly less of the material A towards the coating surface.

14. A method for developing a coating, the method comprising:
   depositing the coating on a substrate, wherein the coating is deposited as a mixed coating comprising a mixture of a material A and a material B, wherein the coating is deposited with a gradient in non-zero proportions of the material B in the mixture over at least part of the coating thickness profile, wherein a proportion of the material B in the mixture at a substrate surface is less than a proportion of the material B in the mixture at a coating surface, wherein the substrate surface is a surface of the substrate on which the coating is deposited and the coating surface is a surface of the coating that faces away from the substrate surface; and
   at least partially removing the material B from the coating after the coating is deposited on the substrate while preserving at least a portion of the material A in an area of the mixture from which the material B is removed.

15. The method according to claim 14, wherein the gradient over the coating thickness profile includes a continuous gradient over the coating thickness profile.

16. The method according to claim 14, wherein the mixture of the material A and material B comprises increasingly less of the material A towards the coating surface.

* * * * *